United States Patent
Leobandung

(10) Patent No.: US 9,590,085 B2
(45) Date of Patent: Mar. 7, 2017

(54) METHOD AND STRUCTURE FOR III-V FINFET

(71) Applicant: International Business Machines Corporation, Armonk, NY (US)

(72) Inventor: Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/045,325

(22) Filed: Feb. 17, 2016

(65) Prior Publication Data
US 2016/0163844 A1    Jun. 9, 2016

Related U.S. Application Data

(62) Division of application No. 14/518,281, filed on Oct. 20, 2014.

(51) Int. Cl.
H01L 29/66    (2006.01)
H01L 29/78    (2006.01)
(Continued)

(52) U.S. Cl.
CPC ........ H01L 29/775 (2013.01); H01L 29/1033 (2013.01); H01L 29/155 (2013.01);
(Continued)

(58) Field of Classification Search
CPC ......... H01L 29/41791; H01L 29/66545; H01L 29/66575; H01L 29/66795; H01L 29/7848;
(Continued)

(56) References Cited

U.S. PATENT DOCUMENTS 7,271,455 B2    9/2007  Cabral, Jr. et al.
2012/0261754 A1  10/2012  Cheng et al.
(Continued)

OTHER PUBLICATIONS

Y.Q. WU et al.; "First experimental demonstration of 100 nm inversion-mode InGaAs FinFET through damage-free sidewall etching"; IEEE International Electron Devices Meeting, IEDM; 2009; whole document (4 pages).
X. Zhang et al.; "A gate-last In0.53G0.47 As channel FinFET with molybdenum source/drain contacts"; European Solid-State Device Research Conference, ESSDERC; 2012; pp. 177-180.
H.-C. Chin et al.; "III-V Multiple-Gate Field Effect Transistors With High-Mobility"; IEEE Electron Device Letters, vol. 32, No. 2; 2011; pp. 146-148.
(Continued)

*Primary Examiner* — Pamela E Perkins
(74) *Attorney, Agent, or Firm* — Harrington & Smith; Louis J. Percello

(57) ABSTRACT

A method for fabricating a semiconductor device comprises forming a fin in a layer of III-V compound semiconductor material on a silicon-on-insulator substrate; forming a semiconductor extension on the fin, the semiconductor extension comprising a III-V compound semiconductor material that is different from a material forming the fin in the III-V compound semiconductor layer; forming a dummy gate structure and a spacer across and perpendicular to the fin; forming a source/drain layer on a top surface of the substrate adjacent to the dummy gate structure; planarizing the source/drain layer; removing the dummy gate structure to expose a portion of the semiconductor extension on the fin; removing the exposed portion of the semiconductor extension; etching the semiconductor extension to undercut the spacer; and forming a replacement gate structure in place of the removed dummy gate structure and removed exposed portion of the semiconductor extension.

20 Claims, 14 Drawing Sheets

(51) Int. Cl.
  *H01L 21/336* (2006.01)
  *H01L 27/088* (2006.01)
  *H01L 29/775* (2006.01)
  *H01L 29/10* (2006.01)
  *H01L 29/40* (2006.01)
  *H01L 29/205* (2006.01)
  *H01L 29/15* (2006.01)

(52) U.S. Cl.
  CPC .......... *H01L 29/205* (2013.01); *H01L 29/401* (2013.01); *H01L 29/6681* (2013.01); *H01L 29/66522* (2013.01); *H01L 29/66545* (2013.01); *H01L 29/66553* (2013.01); *H01L 29/66795* (2013.01); *H01L 29/785* (2013.01); *H01L 2029/7857* (2013.01)

(58) Field of Classification Search
  CPC ............... H01L 29/785; H01L 29/7856; H01L 27/0886; H01L 27/0924; H01L 21/845
  See application file for complete search history.

(56) References Cited

U.S. PATENT DOCUMENTS

| | | |
|---|---|---|
| 2013/0020707 A1 | 1/2013 | Or-Bach et al. |
| 2013/0200454 A1 | 8/2013 | Anderson et al. |
| 2013/0228864 A1 | 9/2013 | Mieno |
| 2014/0374800 A1* | 12/2014 | Cheng ................... H01L 29/785 257/192 |
| 2014/0377918 A1 | 12/2014 | Cheng |
| 2015/0263128 A1 | 9/2015 | Basker |
| 2015/0340488 A1 | 11/2015 | Leobandung |

OTHER PUBLICATIONS

C.-W. Cheng et al.; "Overlapped III-V FinFET with doped semiconductor extensions"; U.S. Appl. No. 13/923,629, filed Jun. 21, 2013.

A. Majumdar et al.; "III-V FET device with overlapped extension regions using gate last"; U.S. Appl. No. 13/950,758, filed Jul. 25, 2013.

J. Lin et al.; "A Self-Aligned InGaAs Quantum-Well Metal-Oxide-Semiconductor Field-Effect Transistor Fabricated through a Lift-Off-Free Front-End Process"; Applied Physics Express 5 (2012); whole document (3 pages).

N. Waldron et al.; "A Self-Aligned InGaAs HEMT Architecture for Logic Applications"; IEEE Transactions on Electron Devices, vol. 57, No. 1; Jan. 2010; whole document (8 pages).

T.W. Kim et al.; "InAs Quantum-Well MOSFET (Lg=100 nm) with Record High gm, fT and fmax"; 2012 Symposium on VLSI Technology Digest of Technical Papers; pp. 179-180.

T.W. Kim et al.; "ETB-QW InAs MOSFET with scaled body for Improved Electrostatics"; 2012 IEEE International Electron Devices Meeting; whole document (4 pages).

J. Lin et al.; "Sub-30 nm InAs Quantum-Well MOSFETs with Self-aligned Metal Contacts and Sub-1 nm EOT HfO2 Insulator"; 2012 IEEE International Electron Devices Meeting; whole document (4 pages).

J.A. Del Alamo; "Nanometre-scale electronics with III-V compound semiconductors"; Nature, vol. 479; Nov. 17, 2011; pp. 317-323.

"List of IBM Patents or Patent Applications Treated as Related"; Feb. 2016; whole document (1 page).

* cited by examiner

METHOD AND STRUCTURE FOR III-V FINFET

CROSS REFERENCE

This patent application is a divisional application of U.S. patent application Ser. No. 14/518,281, filed Oct. 20, 2014, the disclosure of which is incorporated by reference herein in its entirety.

BACKGROUND

The exemplary embodiments of this invention relate generally to semiconductor devices and, more specifically, to semiconductor devices having channel materials incorporating III-V compounds and methods of forming the same.

Compound III-V semiconductor materials may be used as channel materials for semiconductor devices due to their high electron hole mobility. For example, a III-V semiconductor system using InGaAs/InAlAs material may be used due to its large conduction-band offsets and high carrier mobility. Schottky-gated InGaAs high electron mobility transistors (III-V HEMTs) grown on InP substrates have produced maximum transconductance ($g_m$) values and have been shown to compare favorably in terms of a power-delay product.

Conventional III-V HEMTs are self-aligned structures in which the physical length of the gate structure equals the effective length of the channel. However, in III-V HEMTs, gate leakage due to a lack of gate dielectric may limit performance reliability. Thus, a thin gate dielectric layer is often inserted between the gate metal and the wide bandgap barrier layer forming a III-V metal-oxide semiconductor HEMT (III-V MOS-HEMT) or a III-V metal-oxide semiconductor field-effect transistor (III-V MOSFET). The use of a gate dielectric layer has the beneficial effect of reducing gate leakage. In particular, III-V MOS-HEMTs and III-V MOSFETs devices exhibit a leakage reduction of six to ten orders of magnitude compared to a Schottky barrier HEMT of similar design. However, the use of a gate dielectric may undesirably reduce the transconductance because of a larger gate-to-channel separation. Furthermore, decrease of gate-to-source capacitance may cause a shift of threshold voltage ($V_t$) for devices with a doped channel.

Conventional self-aligned III-V MOS-HEMTs and III-V MOSFETs are generally underlapped (i.e., the effective length of the channel is larger than the physical length of the gate structure) due to the fact that ion implantation techniques used in conventional silicon-based MOSFETs to create overlapped devices are not suitable for III-V materials. In III-V devices, damage created from ion implantation and subsequent rapid thermal anneal (RTA) can lead to strain relaxation, which degrades the transport properties of III-V materials. Conventional methods to manage the problem of strain relaxation have involved keeping the RTA temperature low, but this leads to an insufficient diffusion and insufficient activation of implanted ions.

BRIEF SUMMARY

In one exemplary aspect, a method for fabricating a semiconductor device comprises forming a fin in a layer of III-V compound semiconductor material on a silicon-on-insulator substrate; forming a semiconductor extension on the fin, the semiconductor extension comprising a III-V compound semiconductor material that is different or has different doping from a material forming the fin in the III-V compound semiconductor layer; forming a dummy gate structure and a spacer across and perpendicular to the fin; forming a source/drain layer on a top surface of the substrate adjacent to the dummy gate structure; planarizing the source/drain layer; removing the dummy gate structure to expose a portion of the semiconductor extension on the fin; removing the exposed portion of the semiconductor extension; etching the semiconductor extension to undercut the spacer; and forming a replacement gate structure in place of the removed dummy gate structure and removed exposed portion of the semiconductor extension.

In another exemplary aspect, a method for fabricating a semiconductor device comprises forming an insulator layer on a base layer, the insulator layer and the base layer defining a silicon-on-insulator substrate; forming a layer of III-V compound semiconductor material on the insulator layer; forming a plurality of fins in the layer of III-V compound semiconductor material; forming a semiconductor extension on each fin of the plurality of fins, each semiconductor extension comprising a III-V compound semiconductor material that is different from the III-V compound semiconductor material from which the plurality of fins is formed; forming at least one dummy gate structure across and perpendicular to the plurality of fins, each dummy gate structure comprising spacers on opposing sides thereof; forming a source/drain layer adjacent to the spacers on opposing sides of the at least one dummy gate structure; planarizing the source/drain layer; removing the at least one dummy gate structure to form a cavity and expose a portion of the semiconductor extension on the fin; removing the exposed portion of the semiconductor extension from the fin; etching the semiconductor extension to undercut the spacer; and forming a replacement gate structure in the cavity.

In another exemplary aspect, an apparatus for a semiconductor device comprises a substrate comprising a III-V compound semiconductor material; a plurality of fins formed in the III-V compound semiconductor material; a semiconductor extension on each of the fins, the semiconductor extensions each comprising a III-V compound semiconductor material that is different from a material forming the fins; a gate structure and a spacer across and perpendicular to the fins; a source/drain layer on a top surface of the substrate; and a planarization layer on a top surface of the source/drain layer. The semiconductor extensions on each of the fins are etched from under the spacer to provide undercut regions beneath the spacer to expose a topmost surface of each fin to extend the gate/fin junction profile.

BRIEF DESCRIPTION OF THE SEVERAL VIEWS OF THE DRAWINGS

The foregoing and other aspects of exemplary embodiments are made more evident in the following Detailed Description, when read in conjunction with the attached Drawing Figures, wherein.

DETAILED DESCRIPTION

Exemplary embodiments of fin-type field-effect transistor (finFET) semiconductor devices and methods for the fabrication thereof are disclosed herein. Such finFET semiconductor devices include, but are not limited to, III-V compound semiconductor devices such as MOSFETs. However, it should be understood that the disclosed embodiments are merely illustrative of the claimed structures and methods that may be embodied in various forms. The structures and methods disclosed herein may be embodied in many different forms and should not be construed as limited to the exemplary embodiments set forth herein.

Current processing of III-V compound semiconductor devices employs very low temperatures (for example, about 600 degrees C. or less) to avoid dissociation or damage to the III-V compound semiconductor crystal structure and to the interface between the III-V compound semiconductor material and the overlaying gate dielectric. Traditional extension doping to create overlap between semiconductor material and the overlaying gate is achieved through ion implantation. However, although finFET semiconductor devices provide for improved short channel effects as compared to other types of semiconductor devices, the extension junction profile defined by the interface between fins of the III-V compound semiconductor material and the overlaying gate dielectric may not be suitable for traditional ion implantation. Thus, traditional extension doping is not as effective in finFET semiconductor devices using III-V compound semiconductor materials and can cause crystal damage in the III-V compound semiconductor material.

The exemplary methods and structures disclosed herein overcome the drawbacks associated with fabricating finFET semiconductor devices including a semiconductor fin comprising a III-V compound semiconductor material by utilizing epitaxial deposition of doped III-V compound semiconductor materials prior to the formation of the gate.

Figure 1A:
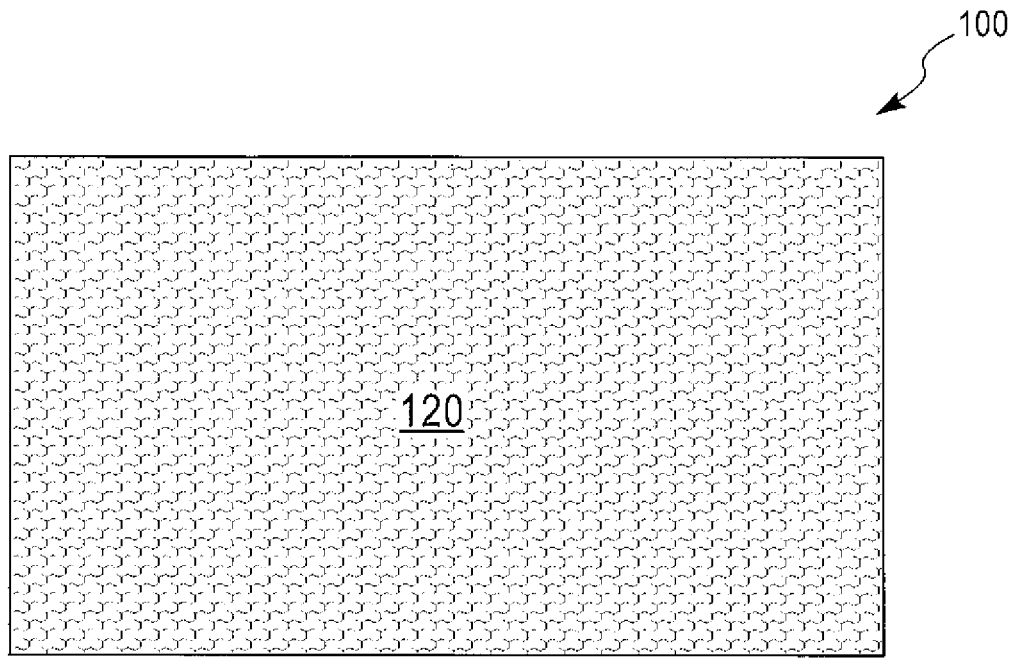
FIG. 1A is a top view of a substrate having a base layer, an insulator layer, and a III-V compound semiconductor layer.
Figure 1B:
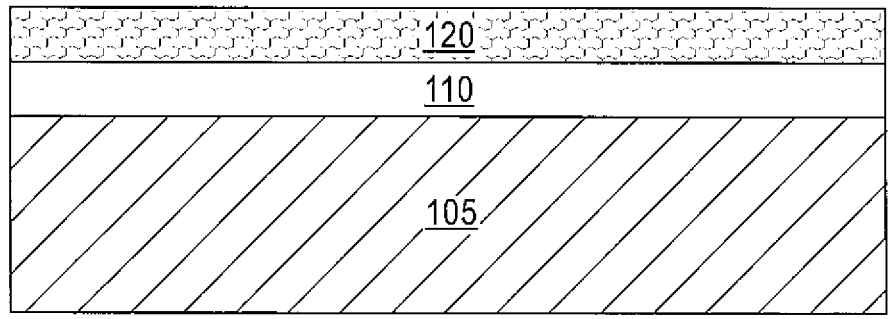
FIG. 1B is a side cross-sectional view of the substrate of FIG. 1A showing the base layer, the insulator layer, and the III-V compound semiconductor layer.

Referring to FIGS. 1A and 1B, a semiconductor-on-insulator (SOI) substrate for use in one exemplary embodiment of the present application is designated generally by the reference number 100 and is hereinafter referred to as "SOI substrate 100." The SOI substrate 100 comprises a base layer 105 or buffer material, an insulator layer 110 disposed on the base layer 105, and a III-V compound semiconductor layer 120. While it is desirable to fabricate this device in SOI substrate, it can also be done on bulk substrate where insulator layer 110 is optional.

The base layer 105 comprises, for example, a semiconductor material, a conductive material, and/or a dielectric material and provides mechanical support to the insulator layer 110 and the III-V compound semiconductor layer 120. The thickness of the base layer 105 may be about 30 microns to about 2 millimeters.

The insulator layer 110 comprises an insulator material such as a dielectric material. Dielectric materials that may be used include, but are not limited to, silicon oxides (such as silicon dioxide ($SiO_2$)), silicon nitrides ($SiN_x$), silicon oxynitrides, alumina, combinations of the foregoing materials, and the like. The thickness of the insulator layer 110 may be from about 50 nanometers (nm) to about 5 microns.

The III-V compound semiconductor layer 120 comprises a semiconductor material that includes III-V compound material. As used herein, the term "III-V" refers to inorganic crystalline compound semiconductors having at least one Group III element and at least one Group V element. Typically, each of the III-V compound semiconductor layers is a binary, ternary, or quaternary III-V containing compound. Exemplary III-V compounds for use in the structures and methods described herein include, but are not limited to, gallium phosphide (GaP), gallium arsenide (GaAs), gallium nitride (GaN), gallium arsenide phosphide (GaAsP), gallium indium arsenide antimony phosphide (GaInAsSbP), aluminum gallium arsenide (AlGaAs), aluminum gallium indium arsenide (AlGaInAs), indium arsenide (InAs), indium gallium phosphide (InGaP), indium gallium arsenide (InGaAs), indium arsenide antimony phosphide (InAsSbP), indium gallium aluminum phosphide (InGaAlP) and combinations of the foregoing. Other examples of III-V compound semiconductors that can be used in the exemplary embodiments disclosed herein include, but are not limited to, alloys of indium aluminum arsenide (InAlAs), indium aluminum arsenide antimony (InAlAsSb), indium aluminum arsenide phosphide (InAlAsP), and indium gallium arsenide phosphide (InGaAsP). As shown, the III-V compound semiconductor layer 120 comprises InGaAs. The thickness of the III-V compound semiconductor layer 120 may be from about 10 nm to about 500 nm. This layer 120 can also be other semiconductor material such as group IV (Si, Ge, SiGe) or group II-VI.

In some exemplary embodiments, the semiconductor material of the III-V compound semiconductor layer 120 may be undoped (e.g., it does not include any n-type or p-type dopant material). In other exemplary embodiments, the semiconductor material of the III-V compound semiconductor layer 120 may be lightly doped. In any embodiment, the semiconductor material of the III-V compound semiconductor layer 120 has a lower dopant content than a doped semiconductor material used in forming source regions, drain regions, and extension regions of a finFET semiconductor device as described herein. In any embodiment, the semiconductor material of the III-V compound semiconductor layer 120 may be may be a single crystalline III-V compound semiconductor material, a polycrystalline III-V compound semiconductor material, or an amorphous III-V compound semiconductor material.

The SOI substrate 100 may be formed using any suitable technique. In one example, the SOI substrate 100 may be formed using a layer transfer process. In another example, the SOI substrate 100 may be formed by deposition of the insulator layer 110 on a surface of bulk substrate material forming the base layer 105, followed by deposition of the III-V compound semiconductor material to form the III-V compound semiconductor layer 120 on the insulator layer 110.

Figure 2A:
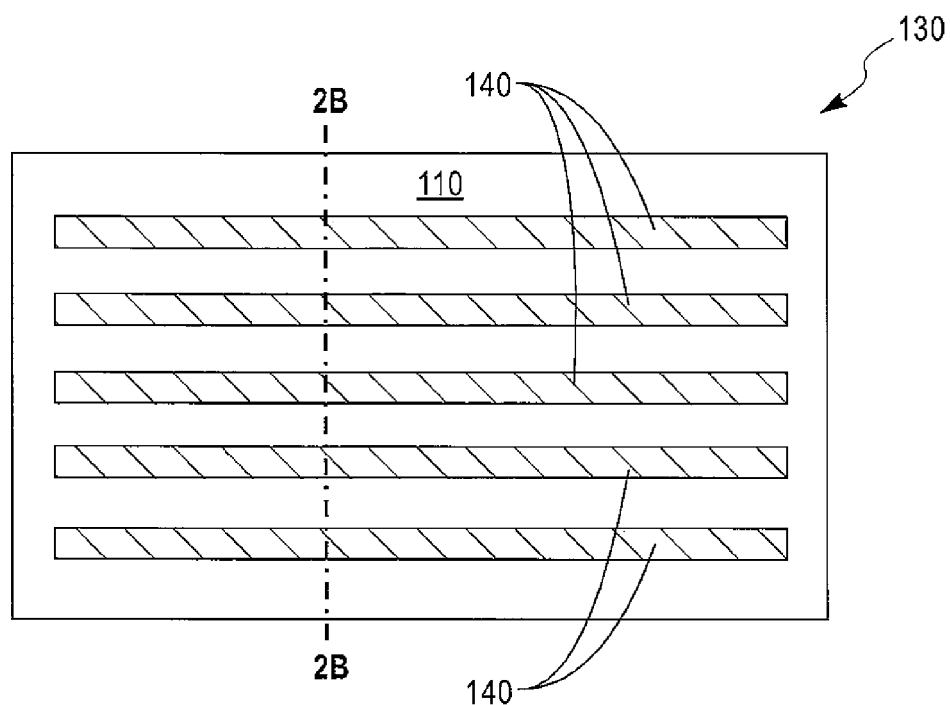
FIG. 2A is a top view of the insulator layer on which a plurality of parallel fins is disposed.
Figure 2B:
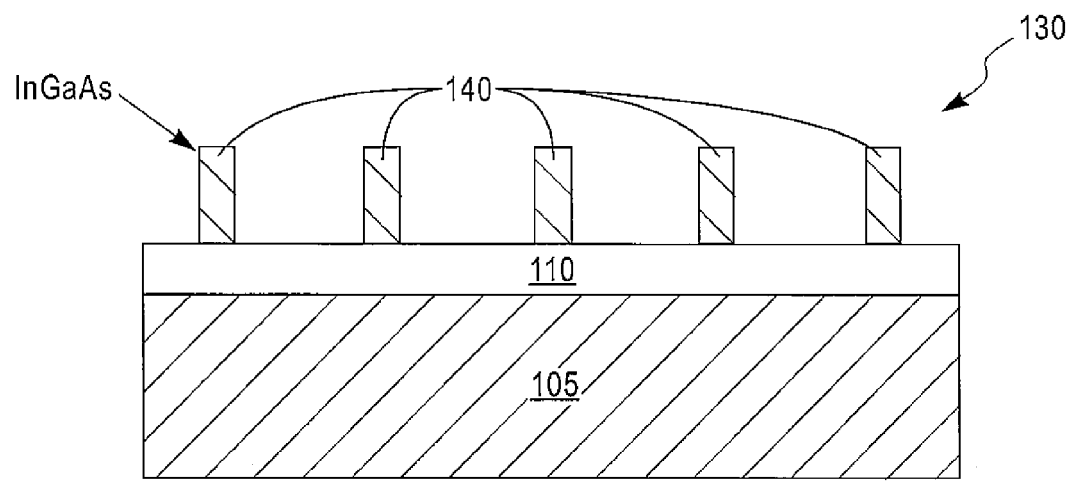
FIG. 2B is a side cross-sectional view of FIG. 2A (perpendicular to the fins) and showing the insulator layer disposed on the base layer.

Referring now to FIGS. 2A and 2B, the SOI substrate 100 is formed into a base semiconductor structure 130 comprising the base layer 105, the insulator layer 110, and a plurality of fins 140 formed from the III-V compound semiconductor layer 120. A fin 140 is herein defined as a contiguous structure comprising a III-V compound semiconductor material (doped or undoped) and including a pair of substantially vertical sidewalls that are parallel to each other. As shown, fins 140 are spaced apart from each other and are oriented parallel to each other. A bottom surface of each fin 140 is in direct contact with an upper surface of the insulator layer 110. Each fin 140 is about 4 nm to about 6 nm in thickness.

The fins 140 are formed in the III-V compound semiconductor layer 120 using, for example, lithography and etching techniques. One exemplary lithography technique may include forming a photoresist on the topmost surface of the III-V compound semiconductor layer 120, exposing the photoresist to a desired pattern of radiation, and then developing the exposed photoresist with a conventional resist developer to provide a patterned photoresist on the III-V compound semiconductor layer 120. At least one etching technique is then employed which transfers the pattern from the patterned photoresist into the III-V compound semiconductor layer 120 utilizing the underlying insulator layer 110 as an etch stop. In one exemplary embodiment, the etch used for pattern transfer may include a dry etch process such as, for example, reactive ion etching (RIE), plasma etching, ion beam etching, or laser ablation. In another exemplary embodiment, the etch used for pattern transfer may include a wet chemical etchant such as, for example, KOH (potassium hydroxide). In yet another embodiment, a combination of a dry etch and a wet chemical etch may be used to transfer the pattern. After transferring the pattern into the III-V compound semiconductor layer 120, the patterned photoresist can be removed utilizing a conventional resist stripping process such as, for example, asking.

In some embodiments, a hardmask such as, for example, a dielectric oxide can be formed by, for example, a deposition process, on the topmost surface of the III-V compound semiconductor layer 120 prior to application of the photoresist. In such an embodiment, the pattern from the patterned photoresist is first transferred into the hardmask and then into the underlying III-V compound semiconductor layer 120. The patterned photoresist may be removed at any point after the hardmask has been patterned. Remaining portions of the hardmask may be removed by performing a planarization process.

Figure 3A:
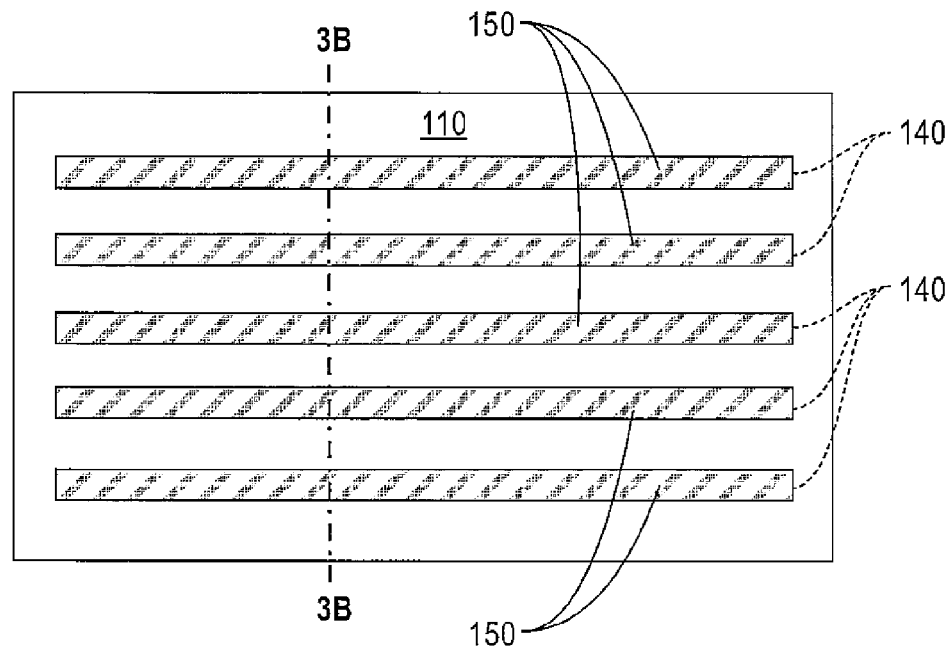
FIG. 3A is a top view of the fins of FIGS. 2A and 2B showing a layer of doped III-V compound semiconductor material as a semiconductor extension disposed on the fins.
Figure 3B:
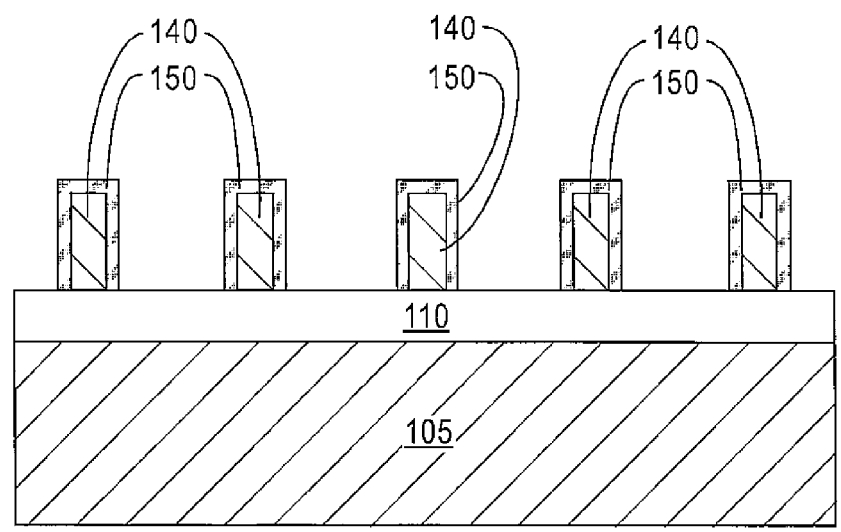
FIG. 3B is a side cross-sectional view of FIG. 3A.

Referring to FIGS. 3A and 3B, in one exemplary embodiment, a III-V compound semiconductor material defining a semiconductor extension 150 is epitaxially grown or otherwise formed on the substantially vertical sidewalls and top surfaces of the fins 140. In some embodiments, the semiconductor extension 150 may be grown only on the substantially vertical sidewalls of the fins 140.

The epitaxially grown III-V compound semiconductor material defining the semiconductor extension 150 may have the same or similar crystalline characteristics as that of the III-V compound semiconductor material forming the fins 140. In one exemplary embodiment, the material of the semiconductor extension 150 may be undoped. However, in other exemplary embodiments, the material of the semiconductor extension 150 may be doped (e.g., the semiconductor extension material may be an n-doped layer of III-V compound semiconductor material, namely, an n-doped layer of InGaAs). In any embodiment, the semiconductor material of the III-V compound semiconductor layer 120 (and accordingly the fins 140 formed therefrom) has a lower dopant content than a doped semiconductor material used in forming source regions, drain regions, and extension regions of a finFET semiconductor device.

In one exemplary embodiment, the semiconductor extension 150 comprises a III-V compound semiconductor material that is different from the III-V compound semiconductor material of the fins 140. For example, when InGaAs is employed as the III-V compound semiconductor material for the fins 140, the material of the semiconductor extension 150 can be, for example, InP or the like.

As used herein, "epitaxially grown" refers to the growth of a semiconductor material on a deposition surface of a semiconductor material, in which the semiconductor material being grown has the same (or substantially the same) crystalline characteristics as the semiconductor material of the deposition surface. In one exemplary embodiment, the material of the semiconductor extension 150 can be epitaxially grown at a temperature of about 300 degrees C. to about 800 degrees C. by contacting the fins 140 with a gas mixture that includes at least one source gas. For example, the semiconductor extension 150 can be epitaxially grown at a temperature of about 400 degrees C. to about 600 degrees C. The semiconductor extension 150 may be epitaxially grown utilizing plasma enhanced chemical vapor deposition (PECVD), a hot-wire chemical vapor deposition process, or the like.

In one exemplary embodiment, a source gas used to deposit the material of the semiconductor extension 150 may comprise at least one Group IIIA-containing precursor and at least one group VA-containing precursor. In another exemplary embodiment, the source gas may comprise at least one Group II-containing precursor and at least one group VI-containing precursor.

The thickness of the semiconductor extension 150 can be about 3 nm to about 5 nm, although lesser and greater thicknesses can also be employed. The semiconductor extension 150 may be a contiguous layer which is in direct physical contact with the entirety (i.e., sidewalls and topmost surface) of each III-V compound semiconductor fin 140. In embodiments in which a hardmask is deposited on the topmost surface of the III-V compound semiconductor layer 120 prior to application of the photoresist, the semiconductor extension 150 includes a first portion that is in direct physical contact with one of, the vertical sidewalls of a fin 140 and a second portion (separate from the first portion) that is in direct physical contact with another vertical sidewall of the same fin 140. In such embodiments, the hardmask material is deposited using low pressure chemical vapor deposition (LPCVD). Hardmask materials that may be deposited on the topmost surface of the III-V compound semiconductor layer 120 include, but are not limited to, any nitride-based dielectric material such as SiN, $Si_3N_4$, silicon carbon nitride, combinations of the foregoing materials, and the like.

Figure 4A:
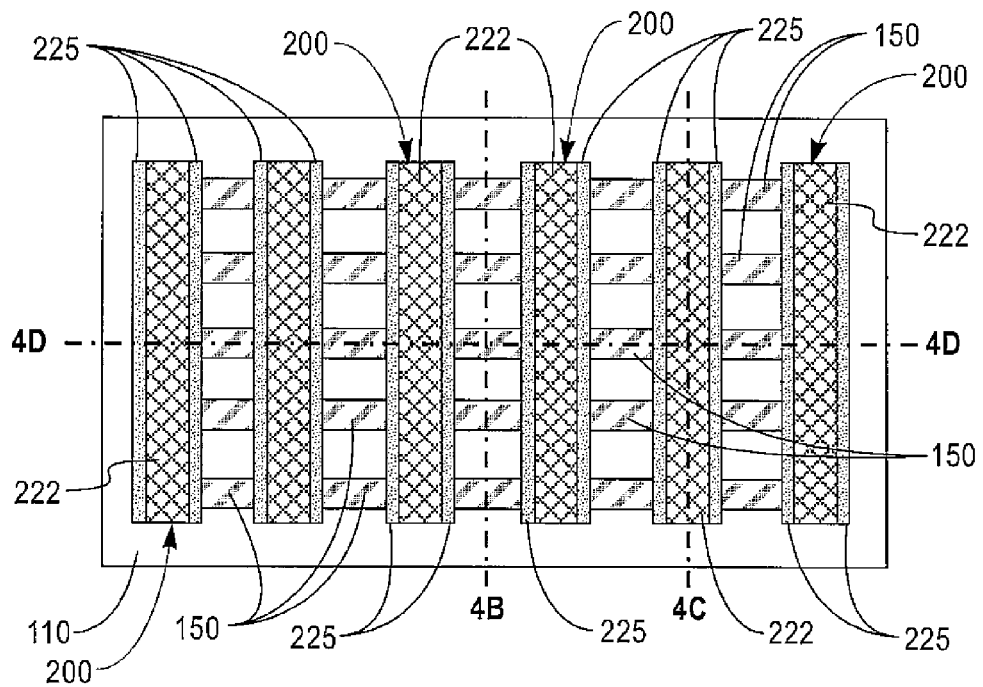
FIG. 4A is a top view of the fins of FIGS. 3A and 3B showing patterned dummy gates and spacers disposed perpendicular to the fins.
Figure 4B:
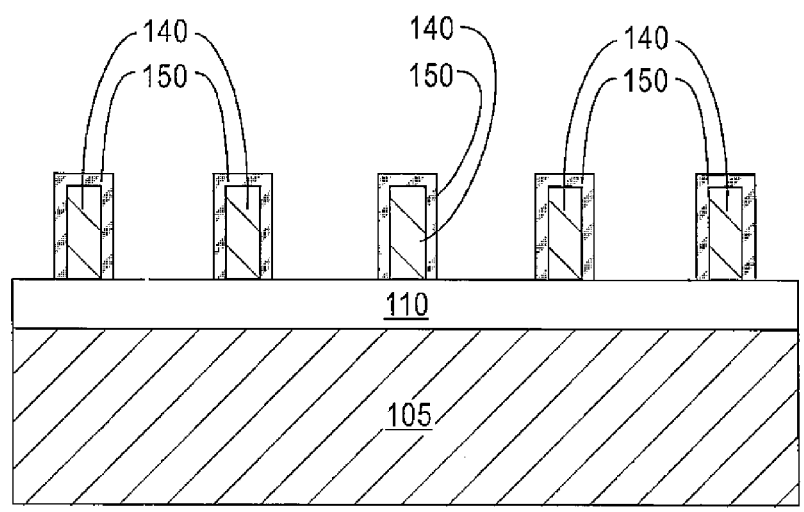
FIG. 4B is a side cross-sectional view of the fins of FIG. 4A.
Figure 4C:
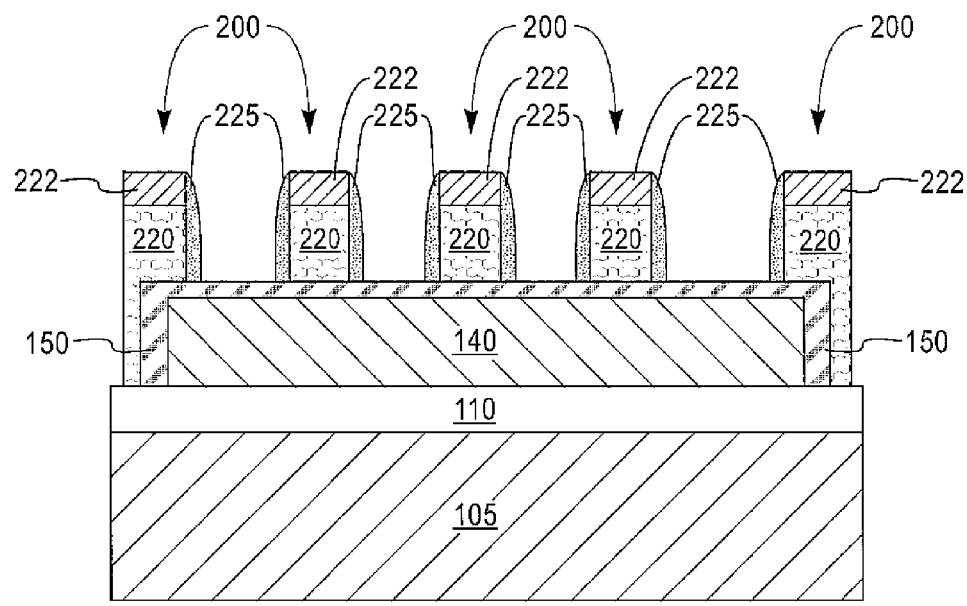
FIG. 4C is a front cross-sectional view of a fin and the dummy gates and spacers of FIG. 4A.

Referring now to FIGS. 4A through 4C, dummy gate structures 200 are disposed on the semiconductor extensions 150 on the fins 140. The dummy gate structures 200 comprise a dummy gate material 220 and a gate hardmask 222 on an upper surface of the dummy gate material 220. The dummy gate structures 200 operate as placeholders and are subsequently removed and replaced with metal gate structures. Each dummy gate structure 200 is oriented substantially perpendicular to and straddles each fin 140. Each dummy gate structure 200 is also spaced from neighboring dummy gate structures 200. While a plurality of dummy gate structures 200 are illustrated, it should be understood that a device in which a single dummy gate structure 200 is employed may be contemplated.

In one exemplary method of forming the dummy gate structures 200, a blanket layer of sacrificial gate material is deposited on the exposed surfaces of the insulator layer 110 and the semiconductor extensions 150 on the fins 140 to form the dummy gate material 220. The blanket layer of sacrificial gate material can be deposited, for example, by chemical vapor deposition (CVD) or PECVD. The thickness of the blanket layer of sacrificial gate material can be from about 50 nm to about 300 nm, although lesser and greater thicknesses can be employed. A blanket layer of gate hardmask material is then deposited on the blanket layer of sacrificial gate material to form the gate hardmask 222. The blanket layer of gate hardmask material and the blanket layer of sacrificial gate material can include any material that can be patterned by lithography and selectively removed during an etching process to form structures having substantially vertical side walls and a top surface that is substantially parallel to the top surface of the insulator layer 110. In one exemplary embodiment, the blanket layer of sacrificial gate material may be polysilicon. In other exemplary embodiments, the blanket layer of sacrificial gate material may be a metal such as, for example, aluminum, tungsten, copper, or insulator such as silicon oxide and silicon nitride.

After the selective removal of the gate hardmask material and blanket layer of sacrificial gate material to form the dummy gate structures 200 (e.g., by RIE), the dielectric spacers 225 are formed on each substantially vertical wall of the dummy gate structure 200 such that each dummy gate structure 200 has, along the longitudinal sides thereof, an adjacently-positioned dielectric spacer 225. The dielectric spacers 225 may be formed by providing a spacer material and etching the spacer material. The spacer material may comprise, for example, an oxide, a nitride, and/or an oxynitride. For example, the spacer material may comprise a silicon oxide or a silicon nitride. The spacer material may be deposited to form the dielectric spacers 225 by a deposition process such as CVD, PECVD, or physical vapor deposition (PVD). Etching of the spacer material may comprise a dry etch process such as RIE.

Figure 5A:
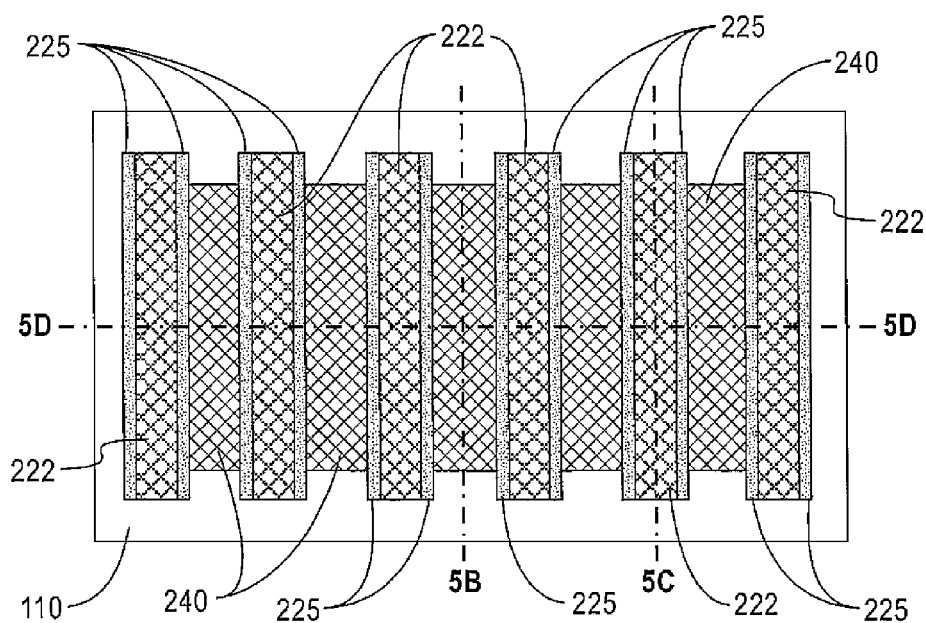
FIG. 5A is a top view of the patterned dummy gates and spacers of FIG. 4A on which an additional source/drain layer is epitaxially grown.
Figure 5B:
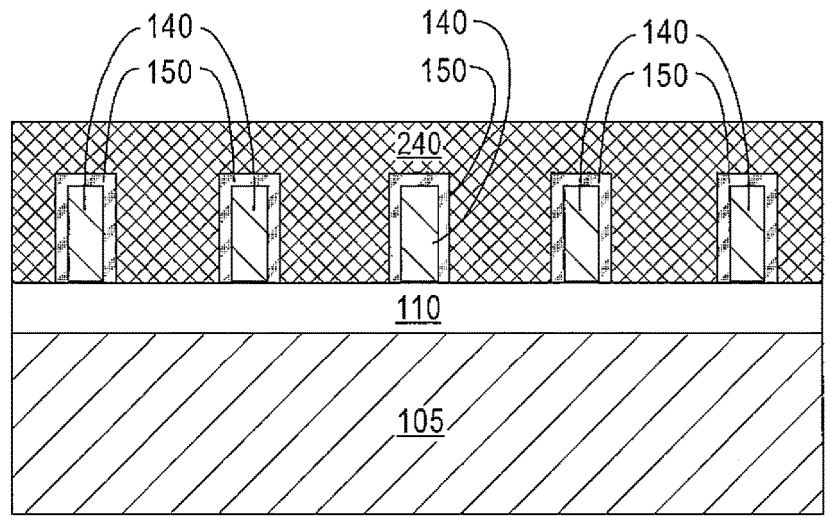
FIG. 5B is a side cross-sectional view of FIG. 5A.
Figure 5C:
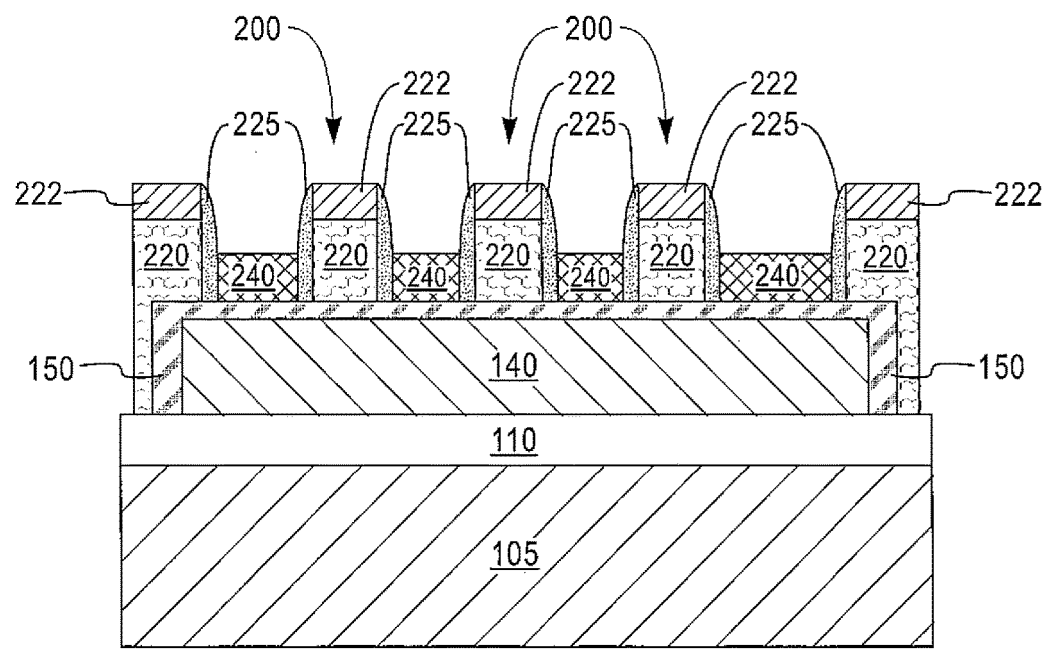
FIG. 5C is a front cross-sectional view of the patterned dummy gates and spacers on which the additional source/drain layer is epitaxially grown.

Referring now to FIGS. 5A through 5C, an additional source/drain layer 240 is formed on the top surface of the insulator layer 110 and on the semiconductor extensions 150 on the fins 140 between the structures formed by the dummy gate structure/spacer arrangements. As can be seen in FIGS. 5B and 5C, the additional source/drain layer 240 extends above the upper surface of the semiconductor extensions 150 on the fins 140 and terminates short of the ends of each spacer 225 of the dummy gate structure/spacer arrangements.

In one exemplary embodiment, the additional source/drain layer 240 comprises a III-V compound semiconductor material. For example, the material of the additional source/drain layer 240 may comprise the same material that defines the semiconductor extension 150. In embodiments in which the material of the additional source/drain layer 240 is the same as that of the semiconductor extension 150, the material of the additional source/drain layer 240 may be doped to be different from the material of the semiconductor extension 150.

In one exemplary embodiment of forming the additional source/drain layer 240, the material of the additional source/drain layer 240 is deposited on the surface of the insulator layer 110 and on the semiconductor extensions 150 using CVD or PECVD to a thickness of about 20 nm to about 60 nm from the top surface of the insulator layer 110, although lesser and greater thicknesses can be employed. In any embodiment, a top surface of the additional source/drain layer 240 is below a top surface of the dummy gate structure/spacer arrangements.

Figure 6A:
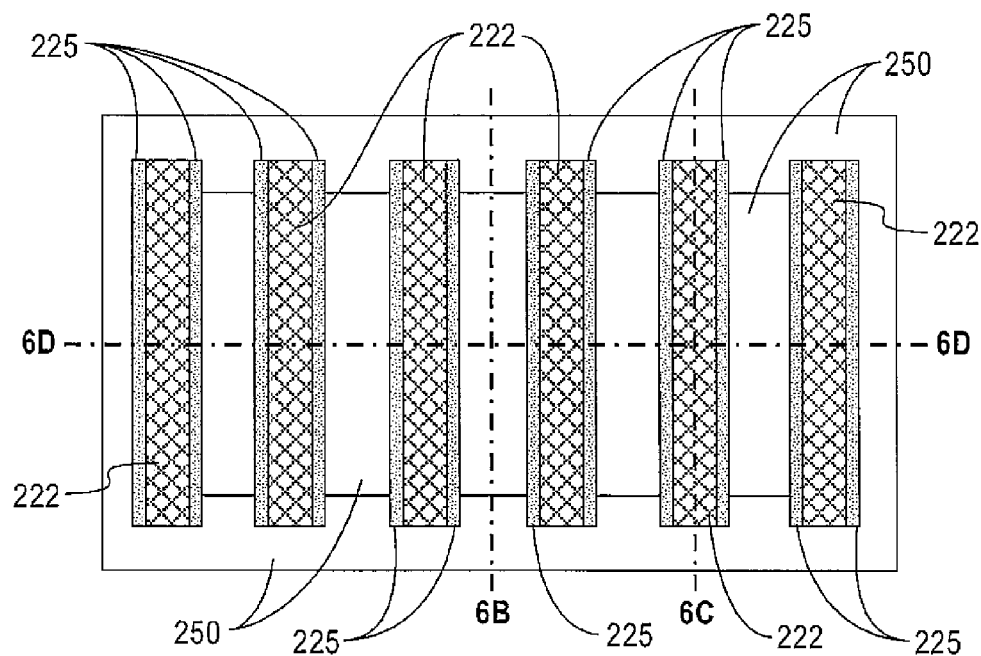
FIG. 6A is a top view of the patterned dummy gates and spacers on which the additional source/drain layer is epitaxially grown and on which an insulator is deposited and planarized.
Figure 6B:
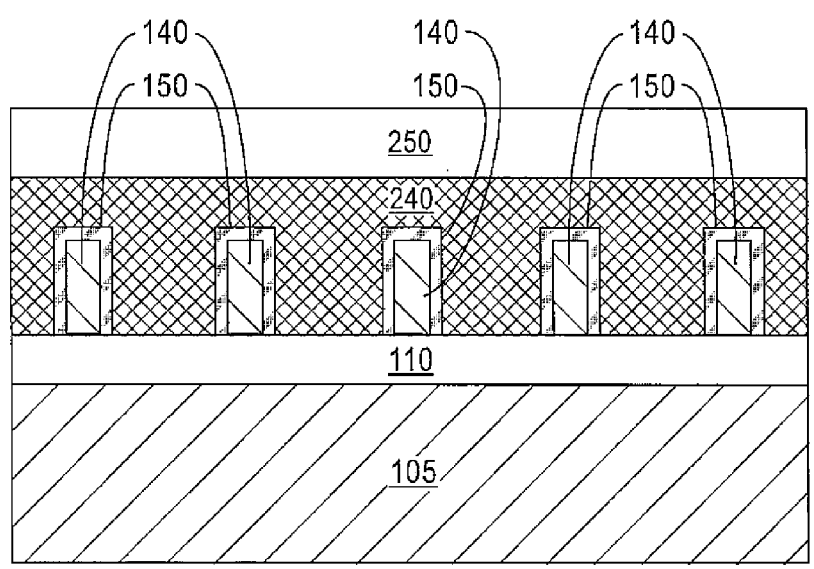
FIG. 6B is a side cross-sectional view of the dummy gate/spacer/insulator arrangement of FIG. 6A through the planarized insulator.
Figure 6C:
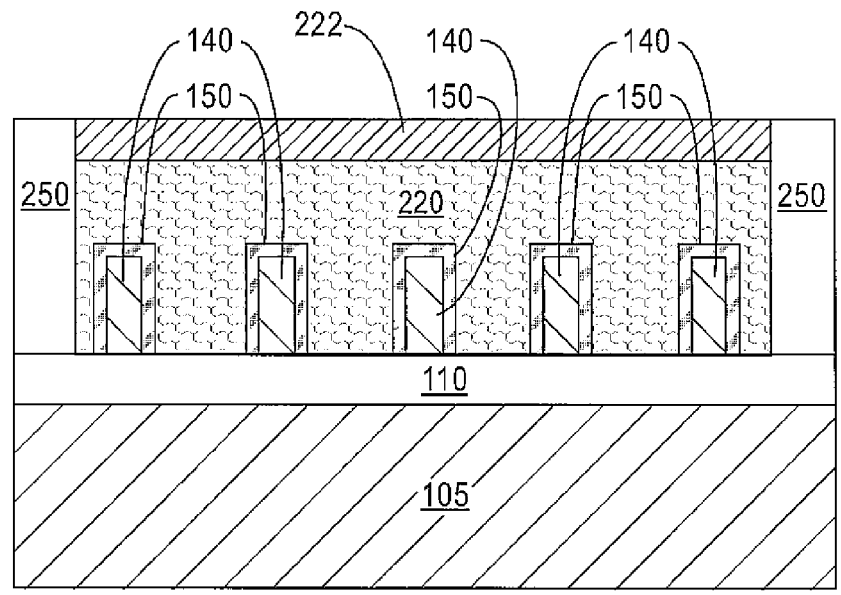
FIG. 6C is a side cross-sectional view of the dummy gate/spacer/insulator arrangement of FIG. 6A through the dummy gate.
Figure 6D:
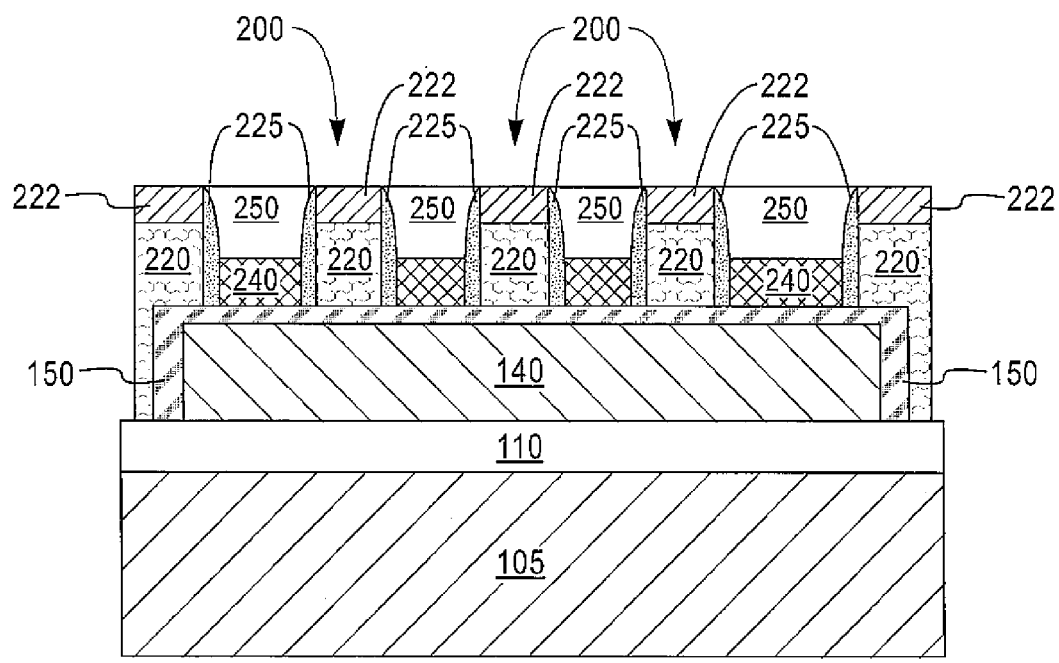
FIG. 6D is a front cross-sectional view of the dummy gate/spacer/insulator arrangement of FIG. 6A.
Figure 7A:
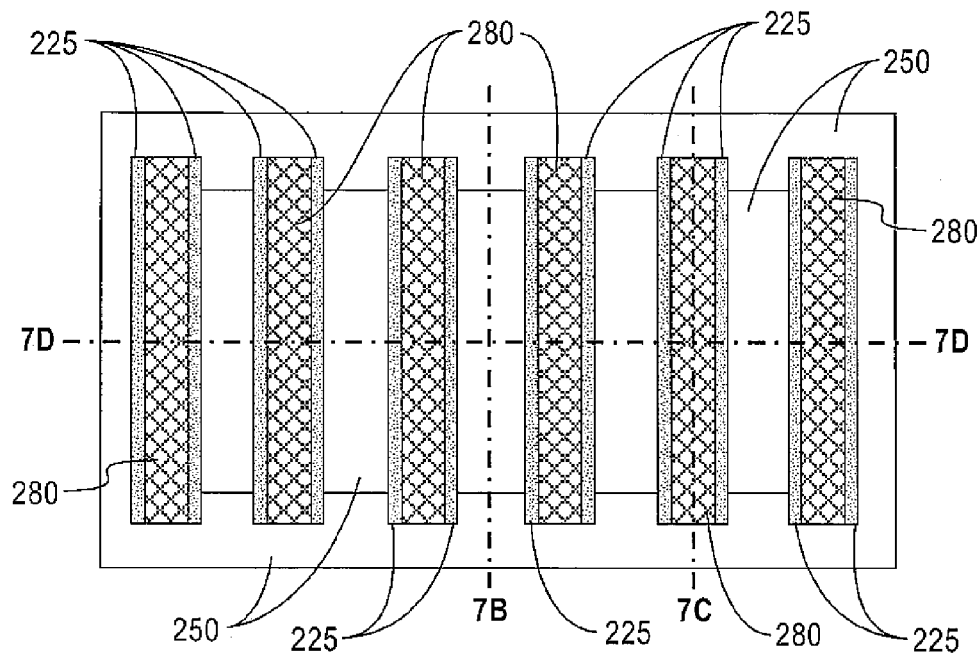
FIG. 7A is a top view of the dummy gate/spacer/insulator arrangement in which the dummy gate is removed.
Figure 7B:
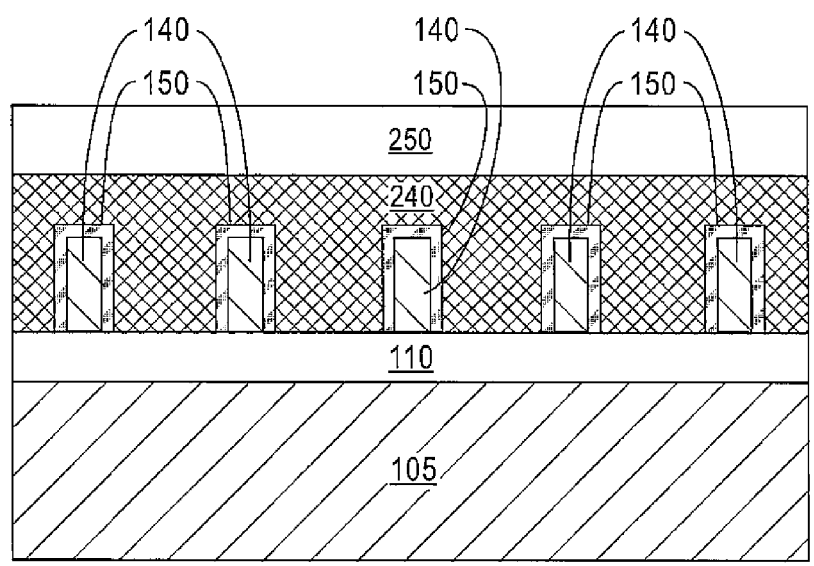
FIG. 7B is a side cross-sectional view of FIG. 7A through the planarized insulator.
Figure 7C:
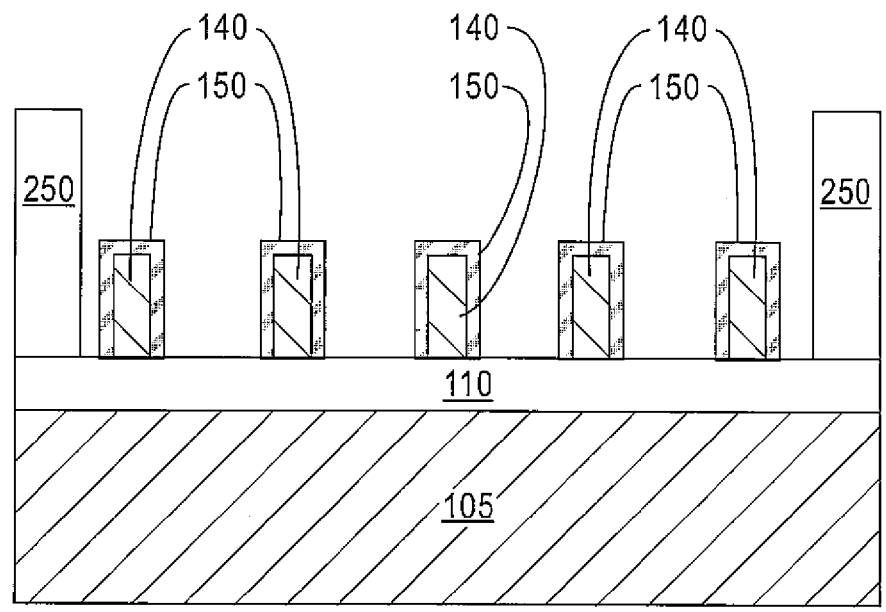
FIG. 7C is a side cross-sectional view of FIG. 7A through a cavity formed by the removed dummy gate.
Figure 7D:
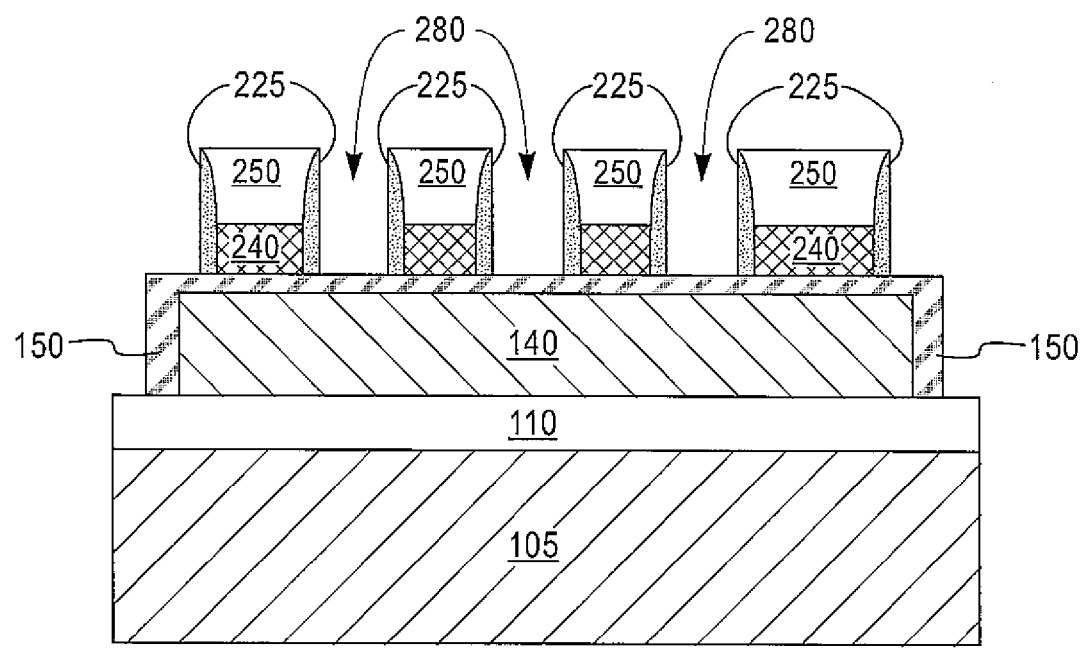
FIG. 7D is a front cross-sectional view of FIG. 7A showing the dummy gates removed.
Figure 8A:
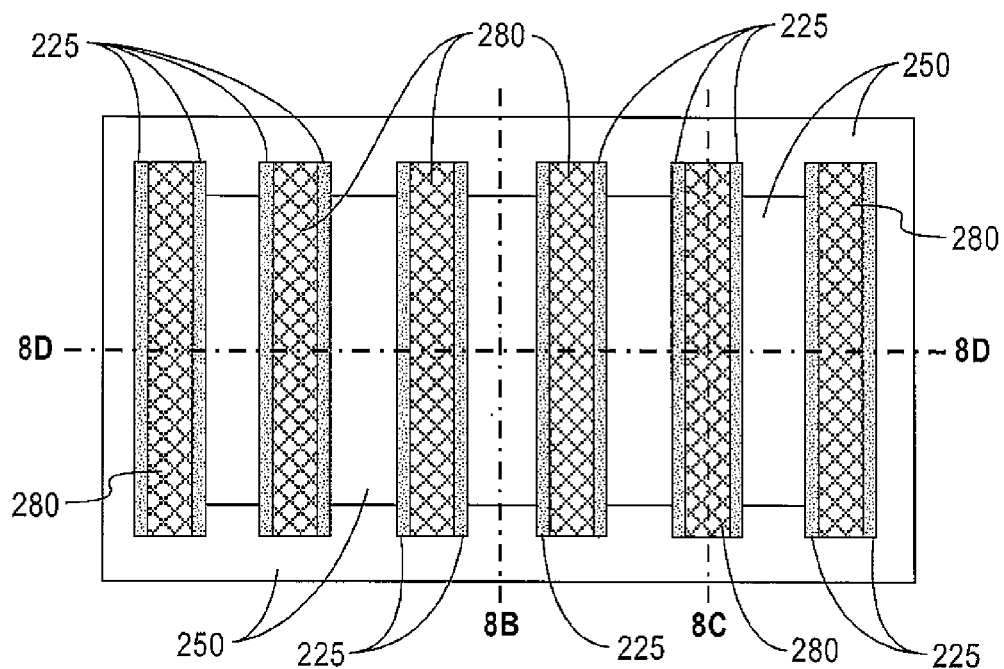
FIG. 8A is a top view of the dummy gate/spacer/insulator arrangement in which the dummy gate is removed and in which portions of the semiconductor extension on the fins under the dummy gate are removed.
Figure 8B:
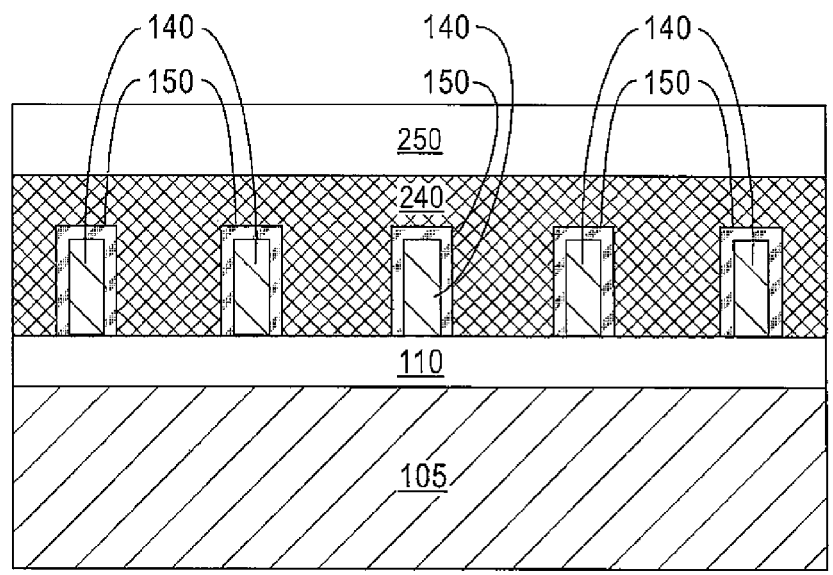
FIG. 8B is a side cross-sectional view of FIG. 8A through the planarized insulator.
Figure 8C:
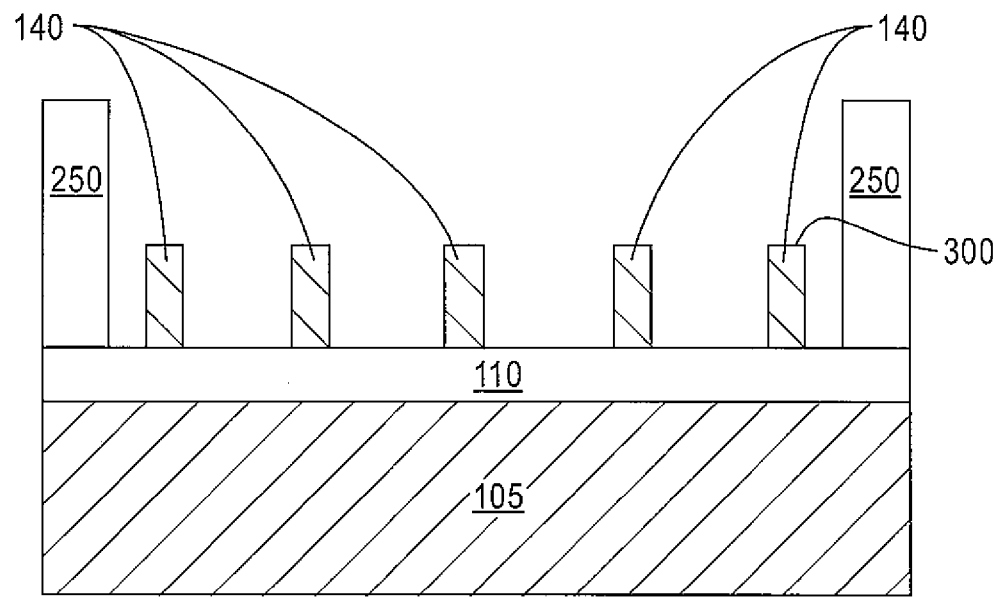
FIG. 8C is a side cross-sectional view of Figure BA through a cavity formed by the removed dummy gate showing the layer of doped III-V compound semiconductor material grown on the fins removed.
Figure 8D:
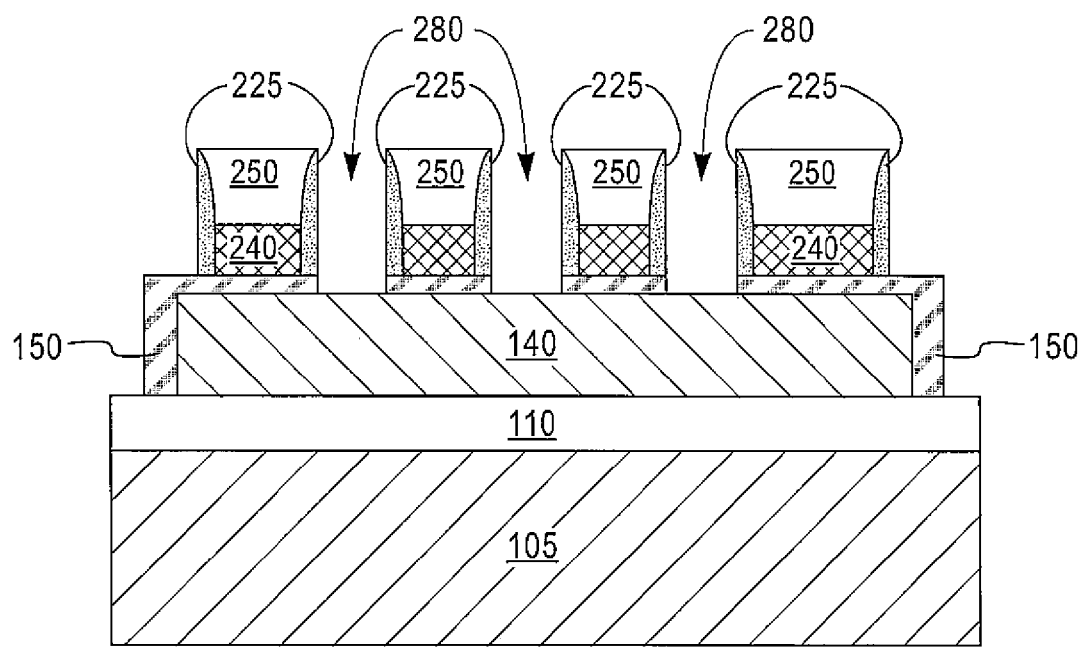
FIG. 8D is a front cross-sectional view of FIG. 8A showing the layer of doped III-V compound semiconductor material grown on the fins removed.

Referring now to FIGS. 6A through 6D, a planarization layer 250 is deposited on the additional source/drain layer 240 and on the top surface of the insulator layer 110. As shown in FIG. 6C, the planarization layer 250 is deposited adjacent to the terminal ends of the dummy gate structure/spacer arrangements. As shown in FIG. 6D, the planarization layer is deposited on the additional source/drain layer 240 between the structures formed by the dummy gate structure/spacer arrangements. The planarization layer 250 is deposited up to the height of the dummy gate structures 200 and spacers 225 to planarize or make level a top surface of the structure.

The planarization layer 250 may comprise, for example, a dielectric material such as silicon dioxide, undoped silicate glass (USG), fluorosilicate glass (FSG), borophosphosilicate glass (BPSG), a low-k dielectric material, or any combination of the foregoing materials. In one exemplary embodiment, the planarization layer 250 may comprise a self-planarizing material such as a spin-on glass (SOG) or a spin-on low-k dielectric material comprising silicon. The use of a self-planarizing material may obviate having to perform a mechanical planarizing operation.

Exemplary embodiments of depositing the material of the planarization layer 250 include, but are not limited to, CVD, PECVD, and spin-on coating. In some embodiments, particularly when dielectric materials are used that are not self-planarizing, the mechanical planarizing operation or an etch back process may be employed. Once deposited, the material of the planarization layer 250 may be about 80 nm to about 500 nm in thickness, although other thicknesses may be employed.

Referring to FIGS. 7A through 7D, the gate hardmask 222 and the dummy gate material 220 located between the spacers 225 are removed. The gate hardmask 222 and the dummy gate material 220 is, in one exemplary embodiment, removed using a combination of wet etch and RIE. Upon removal of the hardmask material and dummy gate material, cavities 280 are formed between the substantially vertical facing inner walls of the spacers 225 (see for example FIG. 7D).

Referring now to FIGS. 8A through 8D, monolayers of the semiconductor extensions 150 in each cavity 280 are removed. Removal of the monolayers of the semiconductor extensions 150 is carried out using a chemical wet etching process. Once removed, a short anneal process may be carried out to diffuse any dopant to create overlap between the semiconductor material of the semiconductor extension 150 and surrounding structure.

Figure 9A:
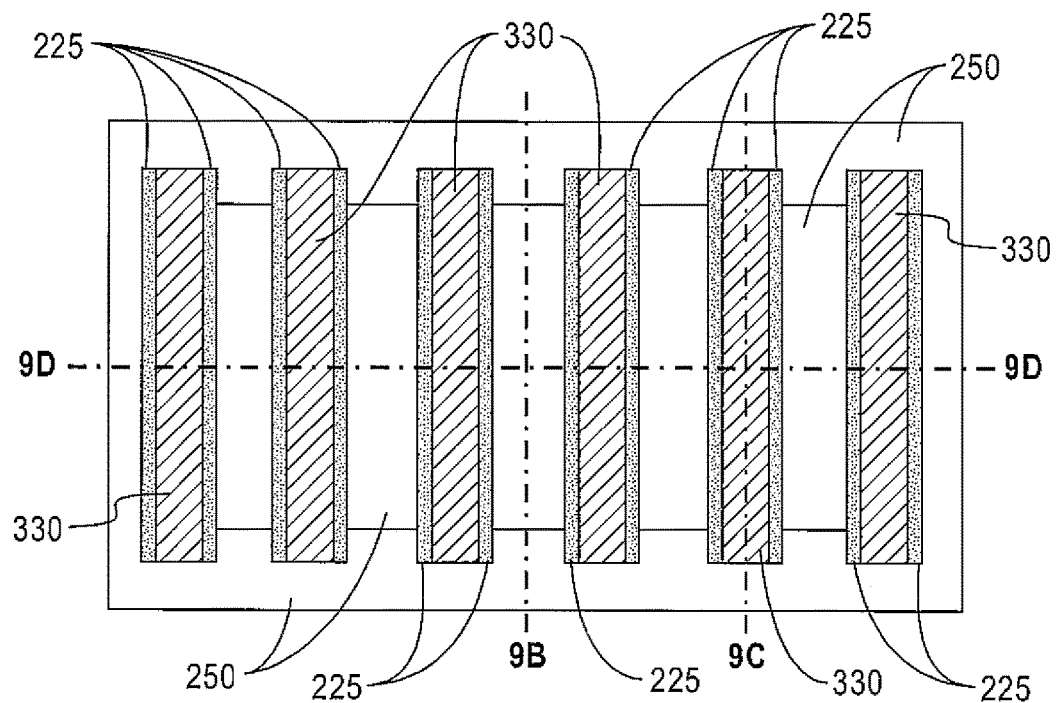
FIG. 9A is a top view of the arrangement of FIG. 8A in which the spacers are undercut and a metal gate is disposed between the spacers.
Figure 9B:
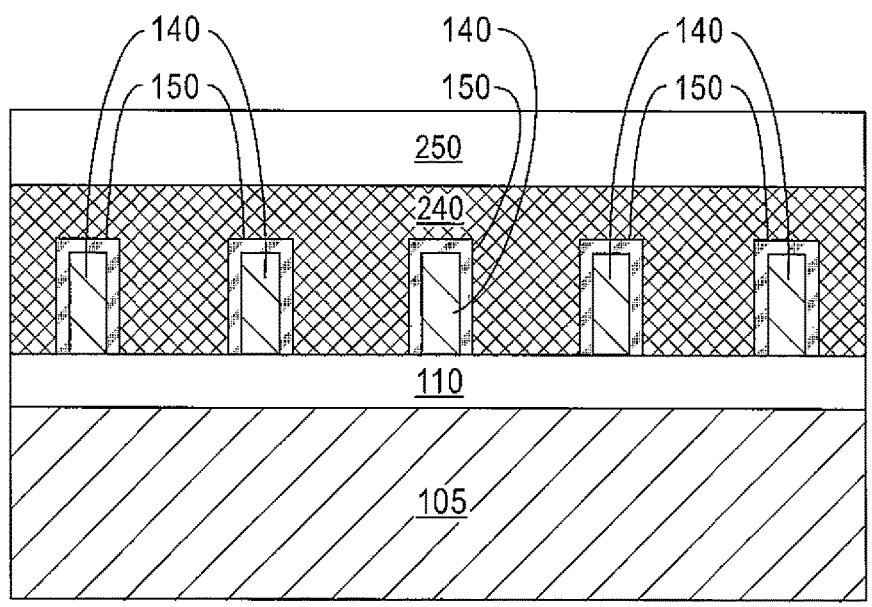
FIG. 9B is a side cross-sectional view of FIG. 9A through the planarized insulator.
Figure 9C:
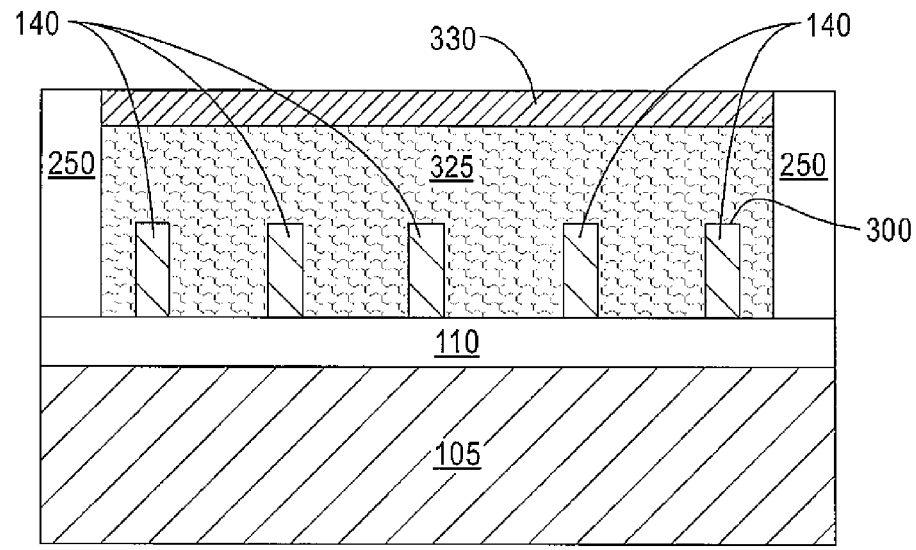
FIG. 9C is a side cross-sectional view of FIG. 9A through the metal gate.
Figure 9D:
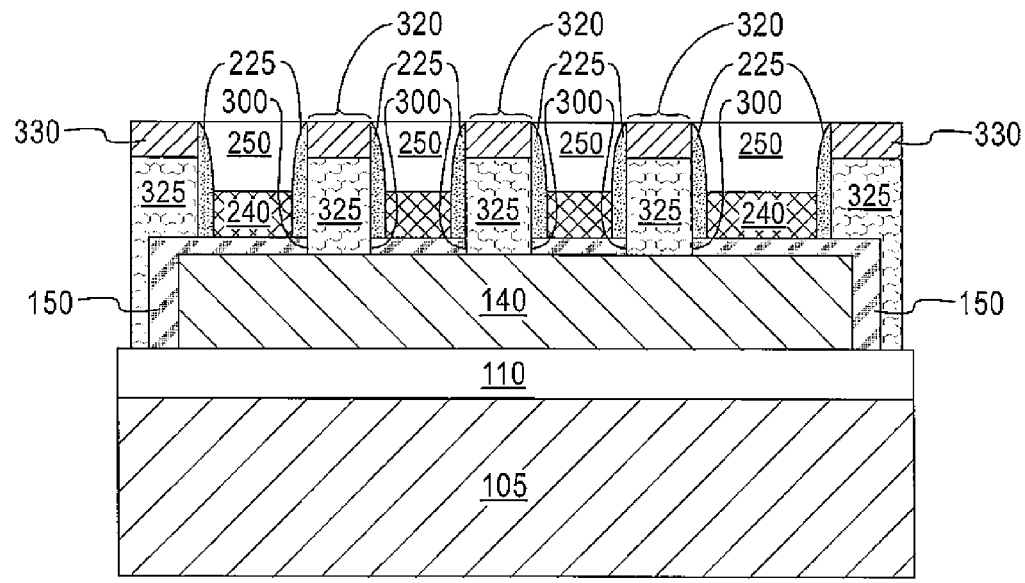
FIG. 9D is a front cross-sectional view of FIG. 9A showing the metal gate between the spacers and the undercut under the spacers.

As shown in FIG. 9D, the semiconductor extensions 150 on the fins 140 are selectively etched from the cavities 280 under the spacers 225. This selective etching provides an undercut region 300 beneath each spacer 225 and further exposes a topmost surface of each fin 140 (see FIG. 9C) thereby extending the gate/fin junction profile.

The selective etching used to form the undercut regions 300 may be an anisotropic etching process. In one exemplary embodiment, such an anisotropic etching process may be a chemical wet etching process. For example, when the semiconductor extension 150 comprises n-doped InGaAs and each fin is undoped InGaAs, aqueous solutions such as hydrochloric acid and/or hydrogen peroxide may be used as chemical etchants to selectively etch portions of the semiconductor extension 150 under the spacers 225.

Referring now to all of FIGS. 9A through 9D, replacement gate structures 320 are disposed in the cavities 280 between the substantially vertical facing inner walls of the spacers 225 to form functional gates. The replacement gate structures 320 each include a gate dielectric portion 325 and a gate conductor portion 330 disposed on the gate dielectric portion 325.

Once the undercut regions 300 are formed under the spacers 225, the gate dielectric portions 325 are deposited in the cavities 280. The gate dielectric portions 325 may be deposited to a depth that is less than a total depth of the cavity 280. Deposition of the gate dielectric portions 325 may be by use of any suitable deposition technique using, for example, CVD or PECVD techniques. In one exemplary embodiment, the material of the gate dielectric portions 325 may comprise silicon oxides (such as silicon dioxide ($SiO_2$)), silicon nitrides ($SiN_x$), silicon oxynitrides, alumina, combinations of the foregoing materials, and the like.

Once the gate dielectric portions 325 are deposited in the cavities 280, a metal is deposited to fill the cavities 280 to form the gate conductor portions 330 on the gate dielectric portions 325. The metal may be deposited using any suitable CVD, PECVD, or PVD technique. Suitable metals include, but are not limited to, aluminum, titanium nitride, tungsten, copper, gold, silver, and the like.

Once the metal is deposited into the cavities 280 and planarized to form the gate conductor portions 330, subsequent processing may be carried out on the source/drain structures (e.g., additional contact formation and back end of line (BEOL) metallization). The resulting structure may be planarized or subject to a chemical mechanical polish.

In one exemplary aspect, a method for fabricating a semiconductor device comprises forming a fin in a layer of III-V compound semiconductor material on a silicon-on-insulator substrate; forming a semiconductor extension on the fin, the semiconductor extension comprising a III-V compound semiconductor material that is different from a material forming the fin in the III-V compound semiconductor layer; forming a dummy gate structure and a spacer across and perpendicular to the fin; forming a source/drain layer on a top surface of the substrate adjacent to the dummy gate structure; planarizing the source/drain layer; removing the dummy gate structure to expose a portion of the semiconductor extension on the fin; removing the exposed portion of the semiconductor extension; etching the semiconductor extension to undercut the spacer; and forming a replacement gate structure in place of the removed dummy gate structure and removed exposed portion of the semiconductor extension.

The method may also comprise forming a semiconductor extension on the fin to define the semiconductor extension to have the same or similar crystalline characteristics as that of the III-V compound semiconductor material forming the fin. The method may also comprise forming a semiconductor extension on the fin to epitaxially grow the III-V compound semiconductor material to form the semiconductor extension. The method may also comprise epitaxially growing the III-V compound semiconductor material on at least one of substantially vertical side walls defining the fin and a top surface defining the fin. The method may also comprise epitaxially growing the III-V compound semiconductor material by doping the III-V compound semiconductor material. The method may also comprise epitaxially growing the III-V compound semiconductor material by utilizing a plasma enhanced chemical vapor deposition technique or a hot-wire chemical vapor deposition technique. The III-V compound semiconductor material of the fin and of the semiconductor extension may comprise gallium phosphide (GaP), gallium arsenide (GaAs), gallium nitride (GaN), gallium arsenide phosphide (GaAsP), gallium indium arsenide antimony phosphide (GaInAsSbP), aluminum gallium arsenide (AlGaAs), aluminum gallium indium arsenide (AlGaInAs), indium arsenide (InAs), indium gallium phosphide (InGaP), indium gallium arsenide (InGaAs), indium arsenide antimony phosphide (InAsSbP), indium gallium aluminum phosphide (InGaAlP), indium aluminum arsenide (InAlAs), indium aluminum arsenide antimony (InAlAsSb), indium aluminum arsenide phosphide (InAlAsP), indium gallium arsenide phosphide (InGaAsP), or combinations of the foregoing materials. The III-V compound semiconductor material of the fin may comprise InGaAs, and the III-V compound semiconductor material of the semiconductor extension may comprise doped InGaAs.

In another exemplary aspect, a method for fabricating a semiconductor device comprises forming an insulator layer on a base layer, the insulator layer and the base layer defining a silicon-on-insulator substrate; forming a layer of III-V compound semiconductor material on the insulator layer; forming a plurality of fins in the layer of III-V compound semiconductor material; forming a semiconductor extension on each fin of the plurality of fins, each semiconductor extension comprising a III-V compound semiconductor material that is different from the III-V compound semiconductor material from which the plurality of fins is formed; forming at least one dummy gate structure across and perpendicular to the plurality of fins, each dummy gate structure comprising spacers on opposing sides thereof; forming a source/drain layer adjacent to the spacers on opposing sides of the at least one dummy gate structure; planarizing the source/drain layer; removing the at least one dummy gate structure to form a cavity and expose a portion of the semiconductor extension on the fin; removing the exposed portion of the semiconductor extension from the fin; etching the semiconductor extension to undercut the spacer; and forming a replacement gate structure in the cavity.

Forming a semiconductor extension on each fin of the plurality of fins may comprise depositing the III-V compound semiconductor material by epitaxial growth. The method may also comprise the III-V compound semiconductor material being epitaxially grown on substantially vertical sidewalls of the fins and/or on top surfaces of the fins. The method may also comprise depositing the III-V compound semiconductor material by epitaxial growth to utilize a plasma enhanced chemical vapor deposition technique or a hot-wire chemical vapor deposition technique. The method may also comprise depositing the III-V compound semiconductor material by epitaxial growth to contact the plurality of fins with a gas mixture comprising at least one source gas at a temperature of about 300 degrees C. to about 800 degrees C. The method may also comprise forming a semiconductor extension on each fin of the plurality of fins to dope the III-V compound semiconductor material of the semiconductor extension with a dopant. The method may also comprise annealing to diffuse the dopant in the III-V compound material of the semiconductor extension at the profile of the junction of the cavity and the semiconductor extension. The III-V compound semiconductor material of the fin may comprise InGaAs, and the III-V compound semiconductor material of the semiconductor extension may comprise doped InGaAs.

In another exemplary aspect, an apparatus for a semiconductor device comprises a substrate comprising a III-V compound semiconductor material; a plurality of fins formed in the III-V compound semiconductor material; a semiconductor extension on each of the fins, the semiconductor extensions each comprising a III-V compound semiconductor material that is different from a material forming the fins; a gate structure and a spacer across and perpendicular to the fins; a source/drain layer on a top surface of the substrate; and a planarization layer on a top surface of the source/drain layer. The semiconductor extensions on each of the fins are etched from under the spacer to provide undercut regions beneath the spacer to expose a topmost surface of each fin to extend the gate/fin junction profile.

In the apparatus, the III-V compound semiconductor material of the semiconductor extension may comprise a dopant relative to the III-V compound semiconductor material of the fins. The III-V compound semiconductor material of the fin may comprise InGaAs, and the III-V compound semiconductor material of the semiconductor extension may comprise doped InGaAs. The III-V compound semiconductor material of the fin may comprise InGaAs, and the III-V compound semiconductor material of the semiconductor extension may comprise InP.

In the foregoing description, numerous specific details are set forth, such as particular structures, components, materials, dimensions, processing steps, and techniques, in order to provide a thorough understanding of the exemplary embodiments disclosed herein. However, it will be appreciated by one of ordinary skill of the art that the exemplary embodiments disclosed herein may be practiced without these specific details. Additionally, details of well-known structures or processing steps may have been omitted or may have not been described in order to avoid obscuring the presented embodiments. It will be understood that when an element as a layer, region, or substrate is referred to as being "on" or "over" another element, it can be directly on the other element or intervening elements may also be present. In contrast, when an element is referred to as being "directly on" or "directly" over another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The description of the present invention has been presented for purposes of illustration and description, but is not intended to be exhaustive or limiting in the form disclosed. Many modifications and variations will be apparent to those of ordinary skill in the art without departing from the scope of the invention. The embodiments were chosen and described in order to best explain the principles of the invention and the practical applications, and to enable others of ordinary skill in the art to understand the invention for various embodiments with various modifications as are suited to the particular uses contemplated.

What is claimed is:

1. An apparatus for a semiconductor device, comprising:
    a substrate comprising a III-V compound semiconductor material;
    a plurality of fins formed in the III-V compound semiconductor material;
    a semiconductor extension on each of the fins, the semiconductor extensions each comprising a III-V compound semiconductor material that is different from a material forming the fins;
    a gate structure and a spacer across and perpendicular to the fins;
    a source/drain layer on a top surface of the substrate; and
    a planarization layer on a top surface of the source/drain layer;
    wherein the semiconductor extensions on each of the fins are etched from under the spacer to provide undercut regions beneath the spacer to expose a topmost surface of each fin to extend the gate/fin junction profile.

2. The apparatus of claim 1, wherein the III-V compound semiconductor material of the semiconductor extension comprises a dopant relative to the III-V compound semiconductor material of the fins.

3. The apparatus of claim 1, wherein the III-V compound semiconductor material of the fin comprises InGaAs, and wherein the III-V compound semiconductor material of the semiconductor extension comprises doped InGaAs.

4. The apparatus of claim 3, wherein the III-V compound semiconductor material of the fin comprises undoped InGaAs, and wherein the III-V compound semiconductor material of the semiconductor extension comprises n-doped InGaAs.

5. The apparatus of claim 1, wherein the III-V compound semiconductor material of the fin comprises InGaAs, and wherein the III-V compound semiconductor material of the semiconductor extension comprises InP.

6. The apparatus of claim 1, wherein the semiconductor extension on each of the fins is about 3 nm to about 5 nm in thickness.

7. The apparatus of claim 1, wherein the semiconductor extension on each of the fins is a contiguous layer on each of the fins.

8. The apparatus of claim 7, wherein the contiguous layer on each of the fins is in direct physical contact with sidewalls and a top surface of each of the fins.

9. The apparatus of claim 1, wherein the gate structure is a replacement metal gate structure.

10. The apparatus of claim 9, wherein the replacement metal gate structure comprises a gate dielectric, portion and a gate conductor portion disposed on a top surface of the gate dielectric portion.

11. The apparatus of claim 1, wherein a material of the spacer comprises an oxide, a nitride, an oxynitride, or a combination of any of the foregoing materials.

12. A semiconductor device, comprising:
a plurality of fins formed in a III-V compound semiconductor material;
a gate structure and at least one spacer associated with each gate structure, the gate structure and the at least one spacer being disposed across the fins;
a semiconductor extension on each of the fins and extending at least partially under the at least one spacer, the semiconductor extensions each comprising a III-V compound semiconductor material that is different from a material forming the fins;
a source/drain layer on a top surface of the semiconductor extension and adjacent to the at least one spacer; and
a planarization layer on a top surface of the source/drain layer.

13. The semiconductor device of claim 12, wherein the III-V compound semiconductor material of the semiconductor extension comprises a dopant relative to the III-V compound semiconductor material of the fins.

14. The semiconductor device of claim 12, wherein the III-V compound semiconductor material of the fin comprises InGaAs, and wherein the III-V compound semiconductor material of the semiconductor extension comprises doped InGaAs.

15. The semiconductor device of claim 14, wherein the III-V compound semiconductor material of the fin comprises undoped InGaAs, and wherein the III-V compound semiconductor material of the semiconductor extension comprises n-doped InGaAs.

16. The semiconductor device of claim 12, wherein the semiconductor extension on each of the fins is about 3 nm to about 5 nm in thickness.

17. The semiconductor device of claim 12, wherein the semiconductor extension on each of the fins is a contiguous layer on each of the fins.

18. The semiconductor device of claim 17, wherein the contiguous layer on each of the fins is in direct physical contact with sidewalls and a top surface of each of the fins.

19. The semiconductor device of claim 12, wherein the gate structure is a replacement metal gate structure.

20. The semiconductor device of claim 19, wherein the replacement metal gate structure comprises a gate dielectric portion comprising silicon oxide, silicon dioxide, a silicon nitride, a silicon oxynitride, alumina, or a combination of the foregoing, and wherein the replacement metal gate structure further comprises a metal disposed on the gate dielectric portion, the metal comprising aluminum, titanium nitride, tungsten, copper, gold, or silver.

* * * * *